(12) United States Patent
Fukui et al.

(10) Patent No.: US 9,406,446 B2
(45) Date of Patent: Aug. 2, 2016

(54) DYE-SENSITIZED SOLAR CELL, METHOD OF PRODUCING THE SAME, AND DYE-SENSITIZED SOLAR CELL MODULE

(75) Inventors: Atsushi Fukui, Osaka (JP); Ryoichi Komiya, Osaka (JP); Nobuhiro Fuke, Osaka (JP); Shinsuke Kobayashi, Osaka (JP); Liyuan Han, Osaka (JP)

(73) Assignee: SHARP KABUSHIKI KAISHA, Osaka-shi, Osaka (JP)

( * ) Notice: Subject to any disclaimer, the term of this patent is extended or adjusted under 35 U.S.C. 154(b) by 809 days.

(21) Appl. No.: 13/002,070

(22) PCT Filed: Jun. 30, 2009

(86) PCT No.: PCT/JP2009/061911
§ 371 (c)(1),
(2), (4) Date: Dec. 30, 2010

(87) PCT Pub. No.: WO2010/001877
PCT Pub. Date: Jan. 7, 2010

(65) Prior Publication Data
US 2011/0094561 A1     Apr. 28, 2011

(30) Foreign Application Priority Data
Jul. 2, 2008    (JP) ................ 2008-173327

(51) Int. Cl.
*H01L 31/00*     (2006.01)
*H01G 9/20*      (2006.01)
*H01G 9/00*      (2006.01)

(52) U.S. Cl.
CPC .......... *H01G 9/2022* (2013.01); *H01G 9/0029* (2013.01); *H01G 9/2031* (2013.01); *H01G 9/2059* (2013.01); *H01G 9/2077* (2013.01); *Y02E 10/542* (2013.01); *Y02P 70/521* (2015.11)

(58) Field of Classification Search
CPC .......................... H01G 9/2022; H01G 9/2077
USPC ........................................................ 136/256
See application file for complete search history.

(56) References Cited

U.S. PATENT DOCUMENTS

| | | |
|---|---|---|
| 4,927,721 A | 5/1990 | Gratzel et al. |
| 5,084,365 A | 1/1992 | Gratzel et al. |

(Continued)

FOREIGN PATENT DOCUMENTS

| | | |
|---|---|---|
| CN | 1860640 A | 11/2006 |
| CN | 101154691 A1 | 4/2008 |

(Continued)

OTHER PUBLICATIONS

Machine translation of JP2005-196982, pub. Jul. 2005.*
International Search Report for PCT/JP2009/061911, mailed Sep. 8, 2009.

*Primary Examiner* — Allison Bourke
(74) *Attorney, Agent, or Firm* — Nixon & Vanderhye, P.C.

(57) ABSTRACT

Provided are a dye-sensitized solar cell wherein a counter electrode composed of a stable counter electrode conductive layer and a catalyst layer is formed on a porous insulation layer, and a dye-sensitized solar cell module wherein the dye-sensitized solar cell is utilized. A dye-sensitized solar cell includes a supporting body made of a light-transmissive material, and a laminate wherein a conductive layer, a photoelectric conversion layer having a porous semiconductor layer with a dye adsorbed therein, a porous insulation layer, a counter electrode conductive layer, and a catalyst layer are laminated in the order presented. The photoelectric conversion layer and the porous insulation lay are filled with a carrier transport material.

7 Claims, 3 Drawing Sheets

(56) References Cited

U.S. PATENT DOCUMENTS

| | | | |
|---|---|---|---|
| 6,291,763 B1* | 9/2001 | Nakamura | 136/256 |
| 6,462,266 B1* | 10/2002 | Kurth | 136/251 |
| 2005/0034755 A1* | 2/2005 | Okada et al. | 136/256 |
| 2005/0092359 A1* | 5/2005 | Uchida et al. | 136/256 |
| 2006/0289057 A1 | 12/2006 | Gonda et al. | |
| 2007/0062576 A1* | 3/2007 | Duerr et al. | 136/263 |
| 2007/0119498 A1* | 5/2007 | Park et al. | 136/256 |
| 2008/0078443 A1 | 4/2008 | Jun et al. | |
| 2008/0245410 A1* | 10/2008 | Duerr et al. | 136/256 |
| 2009/0133741 A1* | 5/2009 | Higuchi et al. | 136/252 |
| 2010/0071743 A1 | 3/2010 | Yamanaka et al. | |
| 2011/0048525 A1 | 3/2011 | Yoneya | 136/256 |

FOREIGN PATENT DOCUMENTS

| | | | |
|---|---|---|---|
| EP | 1 976 051 | | 10/2008 |
| JP | 2664194 | | 6/1997 |
| JP | 2002-367686 | | 12/2002 |
| JP | 2004-247158 | | 9/2004 |
| JP | 2005-196982 | * | 7/2005 |
| JP | 2005-302499 | | 10/2005 |
| JP | 2006-134870 | | 5/2006 |
| JP | 2007-194039 | | 8/2007 |
| JP | 2008-16351 | | 1/2008 |
| WO | WO 97/16838 | | 5/1997 |
| WO | 2007-026927 A1 | | 3/2007 |
| WO | WO 2008/004553 A1 | | 1/2008 |

* cited by examiner

DYE-SENSITIZED SOLAR CELL, METHOD OF PRODUCING THE SAME, AND DYE-SENSITIZED SOLAR CELL MODULE

This application is the U.S. national phase of International Application No. PCT/JP2009/061911 filed 30 Jun. 2009, which designated the U.S. and claims priority to JP Application No. 2008-173327 filed 2 Jul. 2008, the entire contents of each of which are hereby incorporated by reference.

TECHNICAL FIELD

The present invention relates to a dye-sensitized solar cell and a dye-sensitized solar cell module.

BACKGROUND ART

As an energy source replacing fossil fuel, attention is being focused on solar cells capable of converting sunlight into electric power. Some solar cells and thin-film silicon solar cells in which a crystalline silicon substrate is used are currently becoming commercially available. However, the former is disadvantageous in that manufacturing costs of the silicon substrate are high, and the latter is disadvantageous in that the need to use various types of semiconductor production gases and complicated equipment increases manufacturing costs. Therefore, efforts are being made to reduce a cost per power output in any solar cell by increasing photoelectric conversion efficiency, however, the above-mentioned disadvantages have not been solved.

Japanese Patent No. 2664194 (Patent Document 1) proposes, as a new type of solar cell, a wet solar cell to which light-induced electron transfer of a metal complex is applied.

This wet solar cell includes two glass substrates, each having an electrode on a surface, and a photoelectric conversion layer made of a photoelectric conversion material with a light sensitizing dye adsorbed therein to provide an absorption spectrum in a visible light region and an electrolyte material is held between the electrodes.

When light is irradiated onto the above-mentioned wet solar cell, electrons are generated in the photoelectric conversion layer, and the generated electrons travel through an external electric circuit to one of the electrodes, and the traveled electrons are transported to a counter electrode by ions in the electrolyte to return to the photoelectric conversion layer. With such a sequential flow of electrons, electric energy is drawn out.

However, the dye-sensitized solar cell disclosed in Japanese Patent No 2664194 (Patent Document 1) has a basic structure in which the electrolyte solution is injected in between the opposed glass substrates, each equipped with a transparent conductive film, which is difficult to apply to a large-area solar cell, such as one measuring 1 m per side, although a small-area solar cell can be prototyped. In other words, increasing one solar cell in area increases the generated electric current in proportion to the area, however, a voltage drop in an in-plane direction of a transparent conductive film used for an electrode portion increases, which in turn increases the inner series resistance as a solar cell. This in result raises a problem in that FF (fill factor) in current-voltage characteristics during photoelectric conversion and further a short-circuit current are decreased, resulting in degraded photoelectric conversion efficiency.

WO 97/16838 pamphlet (Patent Document 2) proposes a dye-sensitized solar cell module in which a plurality of dye-sensitized solar cells are arranged in series connection on a single glass substrate equipped with a transparent conductive film.

In this dye-sensitized solar cell module, each dye-sensitized solar cell has a structure in which a porous semiconductor layer (porous titanium oxide layer) to be a photoelectric conversion layer, a porous insulation layer (intermediate porous insulation layer), and a counter electrode (catalyst layer) are laminated sequentially on a transparent substrate (glass substrate) with a transparent conductive film (electrode) patterned into strips, and the transparent conductive film of one dye-sensitized solar cell and the counter electrode of an adjacent dye-sensitized solar cell are arranged to come into contact with each other, and both the solar cells are connected in series.

However, a problem arises in that, when forming the catalyst layer on the porous insulation layer by vapor deposition or the like in the step of producing the dye-sensitized solar cell having the module structure disclosed in WO97/16838 pamphlet (Patent Document 2), if particles constituting the catalyst layer have a low film strength, then, the film is stripped from the catalyst layer when the counter electrode conductive layer is formed thereon, so that a solar cell cannot be produced.

Japanese Patent Laying-Open No. 2002-367686 (Patent Document 3) discloses, in a dye-sensitized solar cell module of an integrated structure having a transparent conductive film, a porous semiconductor layer, a porous insulation layer, and a catalyst layer on a transparent substrate, a technique for providing a porous semiconductor layer made of fine particles having an average particle size smaller than that of fine particles constituting the catalyst layer to prevent the fine particles of the catalyst layer from passing through the porous semiconductor layer to reach the conductive layer, thereby avoiding an internal short-circuit.

As described in Japanese Patent Laying-Open No. 2002-367686 (Patent Document 3), when the porous insulation layer is subjected to screen printing through use of a paste of a catalyst material having high flowability, particles constituting the catalyst layer and particles constituting the porous semiconductor layer need to be controlled in particle size because the catalyst material infiltrates into the porous semiconductor layer to cause an internal short-circuit. However, a problem arises in that particle size control to a great degree leads to degraded performance because the particle size of particles of the porous semiconductor layer significantly affects performance.

PRIOR ART DOCUMENTS

Patent Documents

Patent Document 1: Japanese Patent No. 2664194
Patent Document 2: WO 97/16838 pamphlet
Patent Document 3: Japanese Patent Laying-Open No. 2002-367686

SUMMARY OF THE INVENTION

Problems to be Solved by the Invention

The present invention was made to solve the above-described problems, and provides a dye-sensitized solar cell in which a counter electrode composed of a stable counter electrode conductive layer and a catalyst layer is formed on a porous insulation layer, and a method of producing the dye-sensitized solar cell, as well as a method of producing a dye-sensitized solar cell module in which the dye-sensitized solar cell is utilized.

Means for Solving the Problems

The present invention is a dye-sensitized solar cell including a supporting body made of a light-transmissive material, and a laminate in which a conductive layer, a photoelectric conversion layer having a porous semiconductor layer with a dye adsorbed therein, a porous insulation layer, a counter electrode conductive layer, and a catalyst layer are laminated in an order presented, the photoelectric conversion layer and the porous insulation layer being filled with a carrier transport material.

Preferably, pores are formed in the counter electrode conductive layer.

Preferably, the pores of the counter electrode conductive layer have a diameter of 0.1 µm to 100 µm, and the pores of the counter electrode conductive layer are formed at an interval of 1 µm to 200 µm.

Preferably, the counter electrode conductive layer made of one type of material selected from the group consisting of titanium, tungsten and nickel.

Preferably, the counter electrode conductive layer is made of one type of material selected from the group consisting of indium-tin complex oxide, fluorine-doped tin oxide and zinc oxide.

The present invention relates to a method of producing a dye-sensitized solar cell including the steps of forming, on a conductive layer formed on a surface of a supporting body made of a light-transmissive material, a laminate in which a photoelectric conversion layer having a porous semiconductor layer with a dye adsorbed therein, a porous insulation layer, a counter electrode conductive layer, and a catalyst layer are laminated in an order presented, forming a sealing member on an outer periphery of the laminate, arranging a cover layer supported by the sealing member opposite to the catalyst layer, and injecting a carrier transport material into a space held between the conductive layer at an inner side relative to the sealing member and the cover layer, and carried by the sealing member, and the method is characterized in that the counter electrode conductive layer is formed by vapor deposition.

The present invention relates to a method of producing a dye-sensitized solar cell including the steps of forming, on a conductive layer formed on a surface of a supporting body made of a light-transmissive material, a laminate in which a photoelectric conversion layer having a porous semiconductor layer with a dye adsorbed therein, a porous insulation layer, a counter electrode conductive layer, and a catalyst layer are laminated in an order presented, forming a sealing member on an outer periphery of the laminate, arranging a cover layer supported by the sealing member opposite to the catalyst layer, and injecting a carrier transport material into a space held between the conductive layer at an inner side relative to the sealing member and the cover layer, and carried by the sealing member, and the method is characterized in that pores are formed in the counter electrode conductive layer.

Preferably, the pores of the counter electrode conductive layer are formed through use of laser.

The present invention relates to a dye-sensitized solar cell module in which two or more dye-sensitized solar cells are connected in series, at least one of the dye-sensitized solar cells being the dye-sensitized solar cell according to the present invention, a catalyst layer or a counter electrode conductive layer of one of the dye-sensitized solar cells and a conductive layer of an adjacent one of the dye-sensitized solar cells being electrically connected.

Effects of the Invention

The present invention can provide a dye-sensitized solar cell having a favorable photoelectric conversion efficiency in which a counter electrode composed of a stable counter electrode conductive layer and a catalyst layer is formed on a porous insulation layer to prevent the counter electrode conductive layer from stripping off, and a dye-sensitized solar cell module in which the dye-sensitized solar cell is utilized.

MODES FOR CARRYING OUT THE INVENTION

A suitable embodiment of the present invention will now be described with reference to the drawings. It should be noted that this embodiment is merely an example, and various embodiments can be practiced within the scope of the present invention.

<Dye-Sensitized Solar Cell>

Figure 1:
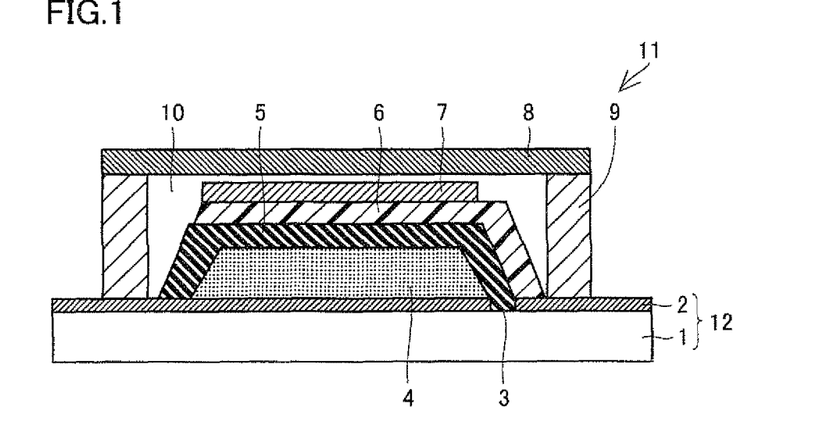
FIG. 1 is a schematic cross sectional view showing a principal part of a layer structure of a solar cell according to the present invention.

FIG. 1 is a schematic cross sectional view showing a principal part of a layer structure of a solar cell (hereinafter, also referred to as "solar cell") according to the present invention.

FIG. 1 shows a supporting body 1, a conductive layer 2, a scribe line 3, a photoelectric conversion layer 4, a porous insulation layer 5, a counter electrode conductive layer 6, a catalyst layer 7, a cover layer 8, a sealing member 9, a carrier transport layer 10, a dye-sensitized solar cell 11, a transparent electrode substrate 12 (composed of supporting body 1 and conductive layer 2 formed thereon).

Dye-sensitized solar cell 11 according to the present invention is a dye-sensitized solar cell including: supporting body 1 made of a light-transmissive material; a laminate in which conductive layer 2 formed on a surface of the supporting body, photoelectric conversion layer 4 having a porous semiconductor layer with a dye adsorbed therein, porous insulation layer 5, counter electrode conductive layer 6, and catalyst layer 7 are laminated in the order presented; sealing member 9 formed on the outer periphery of the laminate; cover layer 8 arranged opposite to the catalyst layer at a certain distance, and supported by the sealing member; and carrier transport material 10 held between the conductive layer at the inner side relative to the sealing member and the cover layer, and carried by the sealing member. The dye-sensitized solar cell is characterized in that counter electrode conductive layer 6 is laminated closer to supporting body 1 serving as a light-receiving surface than catalyst layer 7.

<Supporting Body>

Supporting body 1 is made of at least a light-transmissive material because light transmittance is required of a portion to serve as a light-receiving surface of the solar cell, and preferably has a thickness of about 0.2 to 5 mm.

The material constituting supporting body 1 is not particularly limited only if it is a material that can generally be used for a solar cell and can exert the effects of the present invention. Such a material includes, for example, a glass substrate such as soda glass, fused quartz glass or crystal quartz glass, a heat resistant resin plate such as a flexible film, and so forth.

The material constituting the flexible film (hereinafter, also referred to as "film") includes, for example, tetraacetyl cellulose (TAC), polyethylene terephthalate (PET), polyphenylene sulfide (PPS), polycarbonate (PC), polyarylate (PA), polyetherimide (PEI), phenoxy resin, Teflon (registered trademark), and so forth.

When another layer is formed on the supporting body with heating, for example, when conductive layer 2 is formed on supporting body 1 with heating to about 250° C., Teflon (registered trademark) having a heat resistance higher than or equal to 250° C. is particularly preferable among the above-mentioned film materials.

When a completed solar cell is mounted on another structure, supporting body 1 can be utilized. More specifically, the periphery of supporting body 1 such as a glass substrate can easily be mounted on another supporting body 1 by means of metal workpieces and screws.

<Conductive Layer>

Conductive layer 2, which will serve as a light-receiving surface of the solar cell and thus need to have light transmittance, is made of a light-transmissive material. However, it only needs to be a material that substantially transmits light of a wavelength at least having effective sensitivity for a sensitizing dye that will be described later, and is not necessarily required to have transmittance of light in all the wavelength regions.

The light-transmissive material is not particularly limited only if it is a material that can generally be used for a solar cell and can exert the effects of the present invention. Such a material includes, for example, indium-tin complex oxide (ITO), fluorine-doped tin oxide (FTO), zinc oxide (ZnO), and so forth.

Transparent electrode substrate 12 is composed of supporting body 1 made of a light-transmissive material and conductive layer 2 made of a light-transmissive material laminated thereon. A specific example is a transparent electrode substrate in which a conductive layer made of FTO is laminated on a supporting body made of soda lime float glass, and can be utilized suitably in the present invention.

The light-transmissive conductive layer preferably has a film thickness of about 0.02 to 5 µm, and a film resistance as low as possible, preferably smaller than or equal to 40 Ω/sq.

Conductive layer 2 may be provided with a metal lead wire for reducing the resistance. A material for the metal lead wire includes, for example, platinum, gold, silver, copper, aluminum, nickel, titanium, and so forth.

However, when provision of the metal lead wire will result in reduction in the amount of incident light through the light-receiving surface, the metal lead wire is preferably formed to have a thickness of about 0.1 to 4 mm.

<Scribe Line>

Scribe line 3 is formed by cutting a conductive film by laser scribing.

<Photoelectric Conversion Layer>

Photoelectric conversion layer 4 has a porous semiconductor layer with a dye adsorbed therein and is filled with a carrier transport material.

<Porous Semiconductor Layer>

The porous semiconductor layer is composed of semiconductor, and various forms such as a particle-like form and a film-like form having many micropores can be used, but the film-like form is preferable.

The semiconductor material constituting the porous semiconductor layer is not particularly limited only if it is a material that can generally be used for a photoelectric conversion material. Such a material includes, for example, compounds such as titanium oxide, zinc oxide, tin oxide, iron oxide, niobium oxide, cerium oxide, tungsten oxide, nickel oxide, strontium titanate, cadmium sulfide, lead sulfide, zinc sulfide, indium phosphide, copper-indium sulfide ($CuInS_2$), $CuAlO_2$, and $SrCu_2O_2$, and combinations thereof. Among these, titanium oxide, zinc oxide, tin oxide, and niobium oxide are preferable, and titanium oxide is particularly preferable in terms of photoelectric conversion efficiency, stability and safety. These semiconductor materials can be used as a mixture of two or more types of materials.

In the present invention, titanium oxide includes various types of narrowly-defined titanium oxides, titanium hydroxides, hydrous titanium oxides, and so forth, such as anatase-type titanium oxide, rutile-type titanium oxide, amorphous titanium oxide, metatitanic acid, and orthotitanate, and these can be used alone or as a mixture. Although the two types of crystal system, the anatase-type and the rutile-type, can take either form depending on the manufacturing method and the thermal hysteresis, the anatase-type is common.

The above-mentioned semiconductor constituting the porous semiconductor layer is preferably a polycrystal sintered body made of fine particles in terms of stability, ease of crystal growth, manufacturing costs, and so forth.

The particle size of the above-mentioned fine particles preferably has an average particle size more than or equal to 5 nm and less than 50 nm (preferably more than or equal to 10 nm and less than or equal to 30 nm) from a viewpoint of obtaining a sufficiently large effective surface area relative to a projection area in order to convert incident light into electric energy in high yield.

The light scattering property of the porous semiconductor layer can be adjusted by the particle size (average particle size) of the semiconductor material used for layer formation.

Depending on the conditions for forming the porous semiconductor layer, specifically, a porous semiconductor layer made of semiconductor particles having a large average particle size exhibits strong light scattering, so that incident light can be scattered to improve the light trap coefficient. A porous semiconductor layer made of semiconductor particles having a small average particle size exhibits weak light scattering, so that the dye can be adsorbed at more sites, which can increase the quantity of adsorption.

Therefore, in the present invention, a layer made of semiconductor particles having an average particle size of more than or equal to 50 nm (preferably more than or equal to 50 nm and less than or equal to 600 nm) may be provided on the polycrystal sintered body made of the above-mentioned fine particles.

Although the average particle size of the semiconductor material is not particularly limited only if it falls within the above-mentioned range by which the effects of the present invention can be exerted, the average particle size is preferably uniformized to a certain degree like a commercially-available semiconductor material powder in terms of effective use of incident light for photoelectric conversion.

Although it is common to provide an insulation layer between the porous semiconductor layer and the counter electrode, the counter electrode or the conductive layer may be formed on the porous semiconductor layer made of fine particles having a large particle size (100 nm to 500 nm), as disclosed in Japanese Patent Laying-Open No. 2006-010132.

A porous semiconductor layer exhibiting strong light scattering, particularly, a porous semiconductor layer in contact with counter electrode conductive layer 6 has a low mechanical strength due to the large average particle size of the constituent semiconductor material, which may raise a problem for a solar cell structure. In such a case, a semiconductor material having a large average particle size may be mixed with a semiconductor material having a small average particle size in a ratio less than or equal to 10 wt %, for example, to mechanically strengthen the porous semiconductor layer.

Although not particularly limited, the thickness of the porous semiconductor layer preferably ranges from about 0.5 to 50 μm in terms of photoelectric conversion efficiency.

Particularly, when a layer made of semiconductor particles exhibiting strong light scattering and having an average particle size of more than or equal to 50 nm is provided, that layer preferably has a thickness of 0.1 to 40 μm (preferably 5 to 20 μm), and a layer made of particles having an average particle size of more than or equal to 5 nm and less than 50 nm preferably has a film thickness of 0.1 to 50 μm (preferably 10 to 40 μm).

To improve the solar cell in photoelectric conversion efficiency, it is necessary to cause the porous semiconductor layer to adsorb a greater quantity of a dye that will be described later to form the photoelectric conversion layer. Therefore, a film-like porous semiconductor layer having a large specific surface area is preferable, preferably about 10 to 200 m²/g.

<Dye>

A dye to be adsorbed in the porous semiconductor layer to serve as a photosensitizer includes an organic dye, a metal complex dye and the like having absorption in various visible light regions and/or the infrared light region, and one, two or more types of these dyes can be used selectively.

The organic dye includes, for example, azo-based dyes, quinone-based dyes, quinone-imine-based dyes, quinacridone-based dyes, squarylium-based dyes, cyanine-based dyes, merocyanine-based dyes, triphenylmethane-based dyes, xanthene-based dyes, porphyrin-based dyes, perylene-based dyes, indigo-based dyes, naphthalocyanine-based dyes, and so forth.

The organic dye generally has an absorption coefficient higher than that of a metal complex dye exhibiting a form in which molecules are coordinated to a transition metal.

The metal complex dye includes a form in which molecules are coordinated to a metal such as Cu, Ni, Fe, Co, V, Sn, Si, Ti, Ge, Cr, Zn, Ru, Mg, Al, Pb, Mn, In, Mo, Y, Zr, Nb, Sb, La, W, Pt, Ta, Ir, Pd, Os, Ga, Tb, Eu, Rb, Bi, Se, As, Sc, Ag, Cd, Hf, Re, Au, Ac, Tc, Te, or Rh, and among these, phthalocyanine-based dyes and ruthenium-based dyes are preferable, and ruthenium-based metal complex dyes are particularly preferable.

Particularly, ruthenium-based metal complex dyes expressed by the following formulas (1) to (3) are preferable,

[Chemical Formula 1]

(1)

(2)

(3)

To cause the porous semiconductor layer to strongly adsorb the dye, the dye preferably contains, in molecules, a functional group for interlocking, such as carboxylic acid group, carboxylic acid anhydrous group, alkoxyl group, hydroxyl group, hydroxyalkyl group, sulfonic acid group, ester group, mercapto group, phosphonyl group, or the like. Among these, the carboxylic acid group and the carboxylic acid anhydrous group are particularly preferable. It should be noted that the functional group for interlocking provides electric coupling that facilitates electron transfer between a dye in an excited state and the conduction band of the porous semiconductor layer.

<Porous Insulation Layer>

It is common to provide an insulation layer between the porous semiconductor layer and the counter electrode. As the material for the insulation layer, a material having a high conduction band level, such as glass, zirconium oxide, silicon oxide, aluminum oxide, niobium oxide, or strontium titanate is used.

<Counter Electrode Conductive Layer>

In the case where the catalyst layer such as platinum has a weak film strength, such as in the case of film production by vapor deposition, the counter electrode conductive layer is stripped from the catalyst layer when the counter electrode conductive layer is formed on the catalyst layer formed on the porous insulation layer. Therefore, in the present invention, counter electrode conductive layer 6 is first provided on porous insulation layer 5, and catalyst layer 7 is formed thereon, which is an opposite order of lamination to a typical dye-sensitized solar cell. This lamination order can prevent counter electrode conductive layer 6 from being stripped from above catalyst layer 7.

The material constituting counter electrode conductive layer 6 is not particularly limited only if it is a material that can generally be used for a solar cell and can exert the effects of the present invention. Such a material includes, for example, metal oxides such as indium-tin complex oxide (ITO), fluorine-doped tin oxide (FTO), and zinc oxide (ZnO), and metallic materials such as titanium, tungsten, gold, silver, copper, and nickel. Taking the film strength into consideration, titanium is most preferable.

With film production of counter electrode conductive layer 6 by vapor deposition, the film itself becomes porous, which eliminates the need to form other pores through which a dye solution and a carrier transport material are movable. In the case of forming counter electrode conductive layer 6 by vapor deposition, a pore has an opening of about 1 nm to 20 nm, however, it has been confirmed that the catalyst layer material will not pass through the pores of the counter electrode conductive layer or reach porous insulation layer 5 nor further the porous semiconductor layer (photoelectric conversion layer 7), even when catalyst layer 7 is formed on counter electrode conductive layer 6.

In the case where catalyst layer 7 is formed, by spreading, from a paste with platinum or carbon fine particles dispersed, counter electrode conductive layer 6 needs to be compact in order to suppress penetration of fine particles. In this case, the pores of counter electrode conductive layer 6 may be formed simultaneously with those of catalyst layer 7 after lamination of catalyst layer 7. In this case, a preferable counter electrode conductive layer material is not particularly limited only if it is a material from which a compact film can be formed, such as metal oxides including indium-tin complex oxide (ITO), fluorine-doped tin oxide (FTO), and zinc oxide (ZnO), and metallic materials including titanium, tungsten, gold, silver, copper, and nickel.

An excessively thin film thickness of counter electrode conductive layer 6 will increase resistance, an excessively thick thickness will interfere with the movement of the carrier transport material, and may be selected as appropriate depending on the specific resistance of the material.

The pores are formed by, for example, partial evaporation by laser beam radiation.

The above-mentioned pores are preferably formed to have a diameter of 0.1 μm to 100 μm and at an interval of 1 μm to 200 μm, and more preferably formed to have a diameter of 1 μm to 100 μm and at an interval of 5 μm to 200 μm.

<Catalyst Layer>

The material constituting catalyst layer 7 is not particularly limited only if it is a material that can generally be used for a solar cell and can exert the effects of the present invention. As such a material, for example, platinum and carbon are preferable. As the form of carbon, carbon black, graphite, glass carbon, amorphous carbon, hard carbon, soft carbon, carbon whisker, carbon nanotube, fullerene, and the like are preferable.

<Cover Layer>

Cover layer 8 is important to prevent volatilization of the electrolyte solution and infiltration of water and the like into the cell.

The material constituting cover layer 8 is not particularly limited only if it is a material that can generally be used for a solar cell and can exert the effects of the present invention. Such a material includes, for example, soda lime glass, lead glass, borosilicate glass, fused quartz glass, crystal quartz glass, and so forth. A particularly preferable material is soda lime float glass.

<Sealing Member>

Sealing member 9 is important to prevent volatilization of the electrolyte solution and infiltration of water and the like into the cell.

The sealing member is also important to (1) absorb a fallen object or stress (impact) acting on the supporting body, and (2) absorb a deflection or the like acting on the supporting body during long-term use.

The material constituting sealing member 9 is not particularly limited only if it is a material that can generally be used for a solar cell and can exert the effects of the present invention. As such a material, for example, silicone resin, epoxy resin, polyisobutylene-based resin, hot melt resin, glass frit, and the like are preferable, and two or more types of them can be used in two or more layers. Silicone resin, hot melt resin (e.g., ionomer resin), polyisobutylene-based resin, and glass frit are particularly preferable in the case where a nitril-based solvent or carbonate-based solvent is used as a solvent for a redox electrolyte.

<Carrier Transport Layer>

In the present invention, "carrier transport layer" means a region injected with the carrier transport material, held between conductive layer 2 at the inner side relative to sealing member 9 and cover layer 8, and carried by sealing member 9. Therefore, photoelectric conversion layer 4 and porous insulation layer 5 are filled with the carrier transport material.

Such a carrier transport material is made of a conductive material capable of transporting ions, and a suitable material includes, for example, liquid electrolyte, solid electrolyte, gel electrolyte, fused salt gel electrolyte, and the like.

The liquid electrolyte is any liquid material containing redox species, and is not particularly limited only if it can generally be used in a battery, a solar cell or the like. A specific example includes an electrolyte composed of redox species and a solvent capable of dissolving this, an electrolyte composed of redox species and a fused salt capable of dissolving this, and an electrolyte composed of redox species, a solvent capable of dissolving this and fused salt.

The redox species include, for example, $I^-/I^{3-}$-based, $Br^{2-}/Br^{3-}$-based, $Fe^{2+}/Fe^{3+}$-based, and quinone/hydroquinone-based species, and the like.

More specifically, a combination of metal iodide such as lithium iodide (LiI), sodium iodide (NaI), potassium iodide (KI), or calcium iodide ($CaI_2$) with iodine ($I_2$), a combination of tetraalkylammonium salt such as tetraethylammonium iodide (TEAI), tetrapropylammonium iodide (TPAI), tetrabutylammonium iodide (TBAI), or tetrahexyl ammonium iodide (THAI) with iodine, a combination of metal bromide such as lithium bromide (LiBr), sodium bromide (NaBr), potassium bromide (KBr), or calcium bromide ($CaBr_2$) with bromine are preferable, and among these, the combination of LiI with $I_2$ is particularly preferable.

The solvent for the redox species includes carbonate compounds such as propylene carbonate, nitrile compounds such as acetonitrile, alcohols such as ethanol, water, aprotic polar substances, and so forth. Among these, carbonate compounds and nitrile compounds are particularly preferable. Two types of these solvents can be used in mixture.

The solid electrolyte may be any conductive material capable of transporting electrons, holes and ions, and that can be used as an electrolyte for the solar cell and has no flowability. Specific examples include hole transport materials such as polycarbazole, electron transport materials such as tetranitrofluorenone, conductive polymers such as polyol, polymer electrolytes obtained by solidifying a liquid electrolyte with a polymer compound, p-type semiconductors such as copper iodide and copper thiocyanate, electrolytes obtained by solidifying a liquid electrolyte containing fused salt with fine particles, and so forth.

The gel electrolyte is typically composed of an electrolyte and a gelling agent. The gelling agent includes, for example, polymer gelling agents such as crosslinked polyacrylic resin derivatives, crosslinked polyacrylonitrile derivatives, polyalkylene oxide derivatives, silicone resins, polymers having, at a side chain, a nitrogen-containing heterocyclic quaternary compound salt structure, and so forth.

The fused salt gel electrolyte is typically composed of a gel electrolyte as described above and a room-temperature-type fused salt.

The room-temperature-type fused salt includes, for example, nitrogen-containing heterocyclic quaternary ammonium salt compounds such as pyridinium salts and imidazolium salts.

An additive may be added to the above-described electrolyte as necessary.

Such an additive includes nitrogen-containing aromatic compounds such as t-butylpyridine (TBP), and imidazole salts such as dimethylpropyl imidazole iodide (DMPII), methylpropyl imidazole iodide (MPII), ethyl methyl imidazole iodide (EMII), ethyl imidazole iodide (EII), hexyl methyl imidazole iodide (HMII).

The electrolyte concentration in the electrolyte preferably falls within a range from 0.001 to 1.5 mol/liter, and particularly preferably falls within a range from 0.01 to 0.7 mol/liter. However, in the case where the catalyst layer is located at the light-receiving surface side in the module of the present invention, incident light passes through the electrolyte solution to reach the porous semiconductor layer having the dye adsorbed therein, so that carriers are excited. The performance may thus be degraded depending on the concentration of the electrolyte used for a unit cell in which the catalyst layer is located at the light-receiving surface side, and it is therefore preferable to set the electrolyte concentration taking this point into consideration.

<Drawing Electrode>

Counter electrode conductive layer 6 is provided with a drawing electrode according to necessity.

The material constituting the drawing electrode is not particularly limited only if it is a material that can generally be used for a solar cell and can exert the effects of the present invention.

<Method of Producing Dye-Sensitized Solar Dell>

The method of producing the dye-sensitized solar cell according to the present invention will be described referring to FIGS. 1 and 2.

Figure 2:
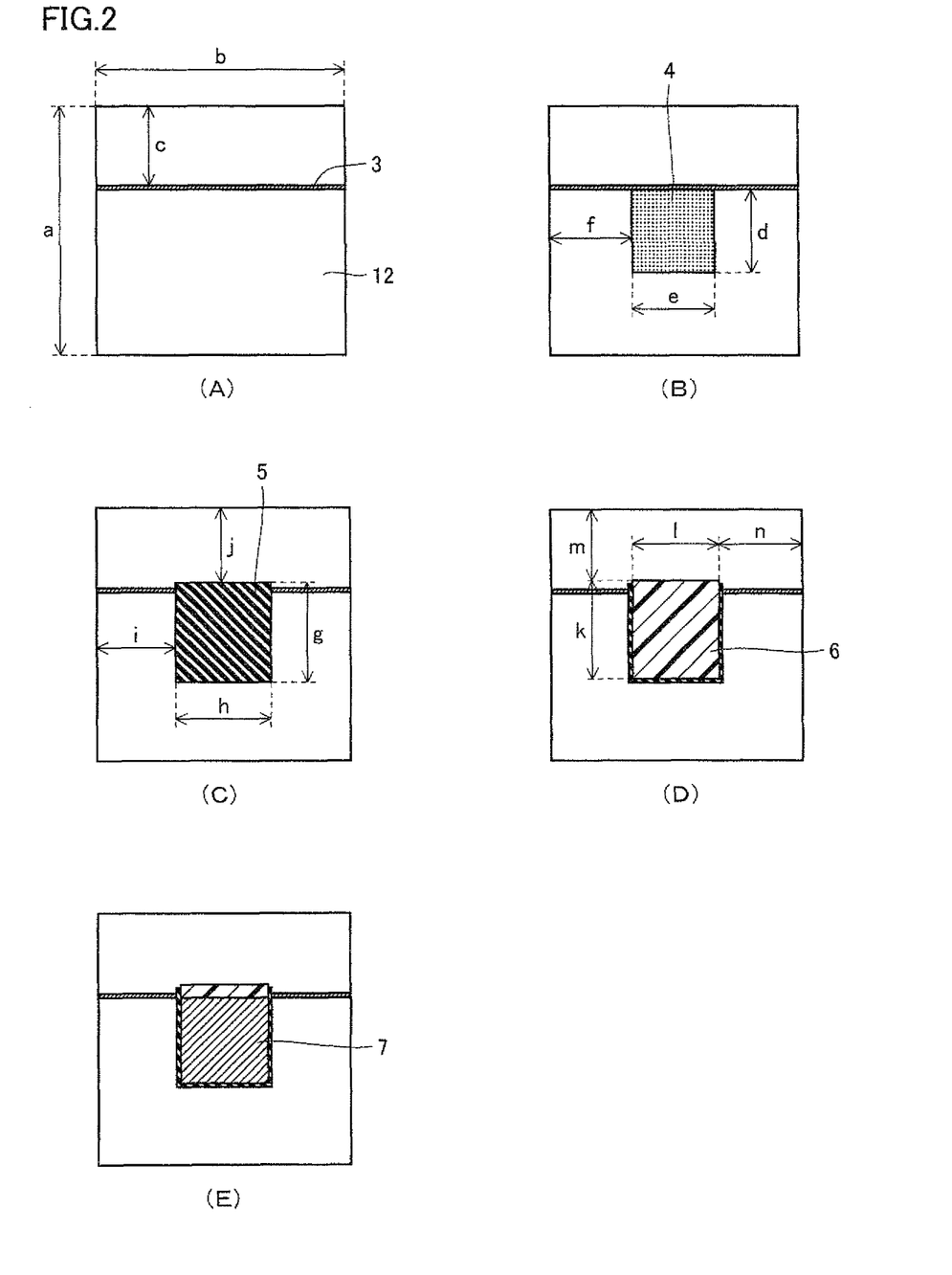
FIG. 2 is a schematic plan view showing steps of producing the solar cell according to the present invention.

FIG. 2 is a schematic plan view showing the steps of producing the solar cell according to the present invention.

FIG. 2 shows transparent electrode substrate 12, scribe line 3, porous semiconductor layer 4, porous insulation layer 5, counter electrode conductive layer 6, and catalyst layer 7.

The method of producing a solar cell according to the present invention includes the steps of: forming, on a surface of supporting body 1 made of a light-transmissive material, a laminate (FIGS. 2(A) to (D)) in which conductive layer 2, photoelectric conversion layer 4 having a porous semiconductor layer with a dye adsorbed therein, porous insulation layer 5, counter electrode conductive layer 6, and catalyst layer 7 are laminated in the order presented; forming sealing member 9 on the outer periphery of the laminate; arranging cover layer 8 opposite to the conductive layer at a distance and supported by the sealing member 9; and injecting a carrier transport material into carrier transport layer 10 held between the conductive layer 2 at an inner side relative to the sealing member 9 and the cover layer 8, and carried by the sealing member 9. The method is characterized by including forming the counter electrode conductive layer 6 by vapor deposition or a step of forming pores in the counter electrode conductive layer 6.

The method of forming conductive layer 2 on supporting body 1 to produce transparent electrode substrate 12 is not particularly limited, and includes, for example, publicly-known sputtering, spraying, and so forth.

In the case where conductive layer 2 is provided with a metal lead wire, a method of forming a metal lead wire on supporting body 1 by, for example, publicly-known sputtering, vapor deposition or the like, and forming conductive layer 2 on supporting body 1 including the obtained metal lead wire, a method of forming conductive layer 2 on supporting body 1, and forming a metal lead wire on conductive layer 2, and the like can be used.

Scribe line 3 is formed by cutting a conductive film by laser scribing (FIG. 2(A)).

The method of forming film-like porous semiconductor layer 4 on conductive layer 2 of transparent electrode substrate 12 is not particularly limited, and includes publicly-known methods (FIG. 2(B)). Specific examples include (1) a method of spreading a paste containing semiconductor particles by screen printing, inkjet printing or the like on the conductive layer, and then firing, (2) a method of depositing a film on the conductive layer by CVD, MOCVD or the like through use of a desired source gas, (3) a method of depositing a film on the conductive layer by PVD, vapor deposition, sputtering or the like through use of a raw material solid, and (4) a method of depositing a film on the conductive layer by the sol-gel process, a process through use of electrochemical redox reaction or the like. Among these methods, screen printing through use of a paste is particularly preferable because a thick porous semiconductor layer can be deposited at low costs.

The method of forming the porous semiconductor layer using titanium oxide as semiconductor particles will now be specifically described.

First, 125 mL of titanium isopropoxide (manufactured by Kishida Chemical Co., Ltd.) is dropped into 750 mL of 0.1M nitric acid solution (manufactured by Kishida Chemical Co., Ltd.) to cause hydrolysis, followed by heating at 80° C. for 8 hours, thereby preparing a sol solution. Then, the obtained sol solution is heated in an autoclave made of titanium at 230° C. for 11 hours to grow titanium oxide particles, followed by ultrasonic dispersion for 30 minutes, thereby preparing a colloidal solution containing titanium oxide particles having an average particle size (average primary particle size) of 15 nm. Then, twice volume of ethanol is added to the obtained colloidal solution, and this is subjected to centrifugal separation at revolutions per minute of 5000 rpm, thereby obtaining titanium oxide particles.

It should be noted that the average particle size as used in the present specification is a value obtained from a diffraction peak in XRD (X-ray diffraction). More specifically, the average particle size is obtained from a half-value width of a diffraction angle in a θ/2θ measurement in XRD and the Scherrer's equation. For example, in the case of anatase-type titanium oxide, a half-value width of a diffraction peak (2θ=around 25.3°) corresponding to a (101) plane may be measured.

Then, the obtained titanium oxide particles are cleaned, to which ethyl cellulose and terpineol dissolved in anhydrous ethanol are added, and the titanium oxide particles are dispersed by stirring. Subsequently, the mixed solution is heated under vacuum conditions to evaporate ethanol, thereby obtaining a titanium oxide paste. As a final composition, for example, concentrations are controlled to contain a titanium oxide solid concentration of 20 wt %, 10 wt % ethyl cellulose, and 64 wt % terpineol.

The solvent used for preparing the paste containing the semiconductor particles (suspended) includes, besides those described above, glycol solvents such as ethylene glycol monomethyl ether, alcohol-based solvents such as isopropyl alcohol, mixed solvents such as isopropyl alcohol/toluene, water, and the like.

Then, the paste containing the semiconductor particles are spread on the conductive layer by the above-described method, and fired to obtain the porous semiconductor layer. Drying and firing need to be controlled in conditions such as temperature, time, and atmosphere depending on the supporting body used, the type of semiconductor particle, and so forth. Firing can be conducted, for example, in an ambient atmosphere or in an atmosphere of inert gas in a range from about 50 to 800° C. for about 10 seconds to 12 hours. This drying and firing can be conducted once at a single temperature, or can be conducted twice or more times at varied temperatures.

The method of causing porous semiconductor layer 4 to adsorb the dye includes, for example, a method of immersing porous semiconductor layer 4 formed on conductive layer 2 into a solution with the dye dissolved therein (solution for dye adsorption).

The solvent in which the dye is to be dissolved may be anything that dissolves the dye, and specific examples include alcohols such as ethanol, ketones such as acetone, ethers such as diethyl ether and tetrahydrofuran, nitrogen compounds such as acetonitrile, halogenated aliphatic hydrocarbons such as chloroform, aliphatic hydrocarbons such as hexane, aromatic hydrocarbons such as benzene, esters such as ethyl acetate, water, and so forth. Two or more types of these solvents can be used in mixture.

Although the dye concentration in the solution can be controlled as appropriate depending on the dye used and the type of solvent, the concentration is preferably as high as possible in order to improve the adsorption function, and may be, for example, higher than or equal to $5 \times 10^{-4}$ mol/liter.

The method of forming film-like porous insulation layer 5 on porous semiconductor layer 4 is not particularly limited, and includes publicly-known methods (FIG. 2(C)). More specifically, (1) a method of spreading a paste containing semiconductor particles on the conductive layer by screen printing, inkjet printing or the like, and then firing, (2) a method of depositing a film on the conductive layer by CVD, MOCVD or the like through use of a desired source gas, (3) a method of depositing a film on the conductive layer by PVD, vapor deposition, sputtering or the like through use of a raw material solid, and (4) a method of depositing a film on the conductive layer by a sol-gel process, a process through use of electrochemical redox reaction or the like are included, Among these methods, screen printing through use of a paste is particularly preferable because a thick-film porous insulation layer can be deposited at low costs.

The method of forming counter electrode conductive layer 6 on porous insulation layer 5 includes vapor deposition, printing and the like (FIG. 2(D)). With film production of the counter electrode conductive layer by vapor deposition, the film itself becomes porous, which eliminates the need to form other pores through which a dye solution and a carrier transport material are movable.

In the case where pores are formed in counter electrode conductive layer 6, for example, a method for partial evaporation by laser beam radiation can be used.

As the method of forming catalyst layer 7 on counter electrode conductive layer 6, a publicly-known forming method such as screen printing, vapor deposition or CVD can be used (FIG. 2(E)).

Sealing member 9 is made by cutting a heat seal film, an ultraviolet-cured resin or the like into a shape that surrounds the periphery of the laminate.

The pattern of sealing member 9 can be formed with a dispenser in the case where silicone resin, epoxy resin or glass frit is used, or can be formed by opening patterned holes in a sheet-like hot melt resin in the case where a hot melt resin is used.

Sealing member 9 is arranged between transparent electrode substrate 12 and cover layer 8 to affix them together, and is fixed by heating or ultraviolet radiation.

The carrier transport material is injected through an injection pore for electrolyte (carrier transport material) previously provided in the cover layer to fill carrier transport layer 10. The injection pore for electrolyte is sealed with an ultraviolet-cured resin after injection of the carrier transport material.

<Solar Cell Module>

Figure 3:
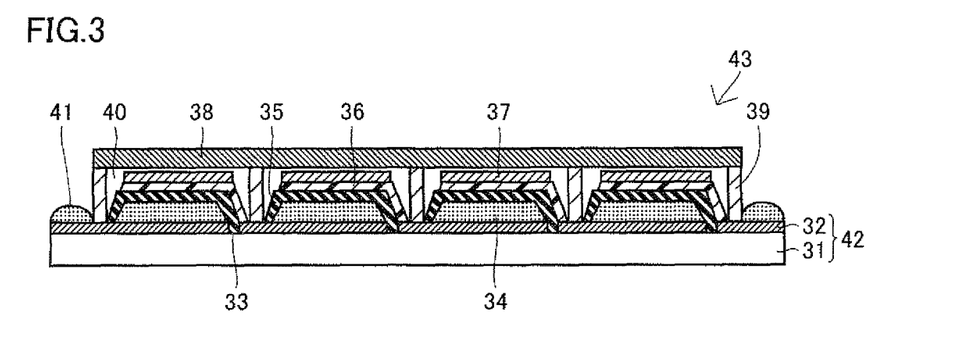
FIG. 3 is a schematic cross sectional view showing a principal part of a layer structure of a solar cell module according to the present invention.

FIG. 3 is a schematic cross sectional view showing a principal part of the layer structure of a solar cell module according to the present invention.

A solar cell module 43 according to the present invention is composed of at least two or more series-connected solar cells including a dye-sensitized solar cell having: a transparent electrode substrate 31; a laminate in which a conductive layer 32 formed on a surface of the transparent electrode substrate 31, a photoelectric conversion layer having a porous semiconductor layer 34 with a dye adsorbed therein, a porous insulation layer 35, a counter electrode conductive layer 36, and a catalyst layer 37 are laminated in the order presented; a sealing member 39 formed on the outer periphery of the laminate; a cover layer 38 located opposite to the catalyst layer 37 at a distance, and supported by the sealing member 39; and a carrier transport layer 40 held between the conductive layer 32 at the inner side relative to the sealing member 39 and the cover layer 38, and carried by the sealing member 39. In other words, at least one of the at least two or more solar cells the constituting the solar cell module only needs to be the solar cell according to the present invention.

The module is characterized in that, as to adjacent solar cells, the catalyst layer or the counter electrode conductive layer of one solar cell and the conductive layer of the other solar cell are electrically connected. In the case where the counter electrode conductive layer is formed on a conventional counter electrode, the counter electrode conductive layer decreases in hardness, raising a problem in the series connection between the adjacent solar cells, however, the formation method and the connection method according to the present invention can provide a more strong electric connection between the adjacent solar cells.

A collector electrode portion 41 may be produced on conductive layer 32 at the outer side relative to sealing member 39 on the outermost periphery of solar cell module 43.

EXAMPLES

The present invention will be described further specifically with reference to examples and comparative examples, however, the present invention is not limited by these examples and comparative examples.
(Production of Solar Cell)

Example 1

Example 1 will be described with reference to FIGS. 2(A) to 2(E).

A 30 mm×30 mm×1.0 mm-thick transparent electrode substrate 12 ($SnO_2$ Coated Glass manufactured by Nippon Sheet Glass, Co., Ltd.) with a conductive layer made of an $SnO_2$ film being deposited on a supporting body made of glass was prepared. As shown in FIG. 2(A), the conductive layer of transparent electrode substrate 12 was cut by laser scribing to form scribe line 3. Then, as shown in FIG. 2(B), a commercially-available titanium oxide paste (manufactured by Solaronix SA, trade name: D/SP) was spread through use of a screen plate having the pattern of porous semiconductor layer 4 and a screen printer (manufactured by NEWLONG SEIMITSU KOGYO CO., LTD., Model No. LS-150), and was subjected to leveling for 1 hour at a room temperature. Then, the obtained coated film was dried for 20 minutes in an oven set at 80° C., and was further fired in air for 60 minutes through use of a firing furnace (manufactured by DENKEN CO., LTD., Model No. KDF P-100) set at 500° C. This spreading and firing step was repeated four times to obtain porous semiconductor layer 4 having a film thickness of 25 μm.

As shown in FIG. 2(C), a paste containing zirconia particles (having an average particle size of 50 nm) was spread on the porous semiconductor layer through use of the screen printer, followed by firing at 500° C. for 60 minutes, thereby forming porous insulation layer 5 whose flat portion has a film thickness of 13 μm.

Then, as shown in FIG. 2(D), 400-nm-thick titanium was deposited on porous insulation layer 5 at a deposition rate of 8 Å/s through use of a mask having a predetermined pattern thereon and a vapor deposition apparatus (manufactured by ANELVA Corporation, Model No. EVD500A) to obtain counter electrode conductive layer 6.

Further, as shown in FIG. 2(E), Pt was deposited on counter electrode conductive layer 6 at a deposition rate 4 Å/s through use of a mask having a predetermined pattern thereon and the vapor deposition apparatus (manufactured by ANELVA Corporation, Model No. EVD500A) to obtain catalyst layer 7. It is to be noted that the catalyst layer was identical in size and position to the porous semiconductor layer.

FIGS. 2(A) to 2(E) show respective dimensions: a of 30 mm; b of 30 mm; c of 10 mm; d of 10 mm; e of 10 mm; f of 10 mm; g of 10.4 mm; h of 10.2 mm; i of 9.9 mm; j of 9.8 mm; k of 10.5 mm; l of 10 mm; m of 9.6 mm; and n of 10 mm.

Then, the above-described laminate was immersed in the previously-prepared solution for dye adsorption at a room temperature for 100 hours, and then, the laminate was cleaned with ethanol and dried at about 60° C. for about 5 minutes to cause the porous semiconductor layer to adsorb the dye.

The solution for dye adsorption was prepared by dissolving the dye expressed by the above-mentioned formula (2) (manufactured by Solaronix SA, trade name: Ruthenium620 1H3TBA) in a mixed solvent of acetonitrile and t-butanol in a volume ratio of 1:1 so as to achieve a concentration of $4 \times 10^{-4}$ mol/liter.

Then, the substrate with the laminate formed thereon and a glass substrate are affixed together through use of a heat seal film (manufactured by E. I. du Pont de Nemours and Company, Himilan 1855) cut into a shape that surrounds the periphery of the laminate, and were heated for 10 minutes in an oven set at about 100° C. to compression bond them. It is to be noted that the heat seal film as fused serves as the sealing member.

Then, the previously-prepared electrolyte solution was injected through the injection pore for electrolyte solution previously provided in the glass substrate, and the injection pore for electrolyte solution was sealed with an ultraviolet-cured resin (manufactured by ThreeBond Co., Ltd., Model No. 31X-101), to fill the carrier transport layer with the carrier transport material, thereby completing the solar cell (unit cell).

The electrolyte solution was obtained by adding to and dissolving in, acetonitrile serving as a solvent, LiI (manufactured by Sigma-Aldrich Corporation) in a concentration of 0.1 mol/liter and $I_2$ (manufactured by Kishida Chemical Co., Ltd.) in a concentration of 0.01 mol/liter, both serving as redox species, and further, t-butyl pyridine (manufactured by Sigma-Aldrich Corporation) in a concentration of 0.5 mol/liter and dimethylpropyl imidazole iodide (manufactured by SHIKOKU CHEMICALS CORPORATION) in a concentration of 0.6 mol/liter, both serving as additives.

An Ag paste (manufactured by FUJIKURAKASEI CO., LTD., trade name: DOTITE) was spread on the obtained solar cell as a collector electrode portion.

Example 2

After counter electrode conductive layer 6 was formed in Example 1, pores were formed in counter electrode conductive layer 6 through use of laser. It is to be noted that the pores were arranged in an array, and formed to have a pore diameter of 50 μm and at an interval of 150 μm both in the X direction and the Y direction. The pores were formed only in a portion where the porous semiconductor layer was projected. Except this, the dye-sensitized solar cell was produced in accordance with Example 1.

Example 3

Counter electrode conductive layer 6 was produced by printing, although produced through use of the vapor deposition apparatus in Example 1. First, a commercially-available ITO paste (DX-400 manufactured by SUMITOMO METAL MINING CO., LTD.) a commercially-available ITO paste (manufactured by Solaronix SA, trade name: D/SP) was spread through use of a screen plate having the same pattern as that formed by vapor deposition and the screen printer (manufactured by NEWLONG SEIMITSU KOGYO CO., LTD., Model No. LS-150), and was subjected to leveling for 1 hour at a room temperature. Then, the obtained coated film was dried for 20 minutes in an oven set at 80° C., and was further fired in air for 60 minutes through use of a firing furnace (manufactured by DENKEN CO. LTD., Model No. KDF P-100) set at 500° C. to obtain counter electrode conductive layer 6 having a film thickness of 5 μm. Except this, the dye-sensitized solar cell was produced in accordance with Example 1.

Example 4

Except that the counter electrode conductive layer had a film thickness of 150 μm in Example 1, the dye-sensitized solar cell was produced in accordance with Example 1.

Example 5

Except that counter electrode conductive layer 6 had a film thickness of 500 μm in Example 1, the dye-sensitized solar cell was produced in accordance with Example 1.

Comparative Example 1

Except that the catalyst layer was formed on the porous insulation layer in Example 1, and that the counter electrode conductive layer was further formed on the catalyst layer, the dye-sensitized solar cell was produced in accordance with Example 1, however, it was confirmed that the counter electrode conductive layer was stripped off.
(Evaluation Method and Results)

A black mask whose opening had an area of 1.0 cm$^2$ was disposed on the light-receiving surface of each of the solar cells of Examples 1 to 5 and Comparative Example 1, and each of these solar cells was irradiated with light having an intensity of 1 kW/m$^2$ (AM 1.5 solar simulator) to measure the photoelectric conversion efficiency. The results are shown in Table 1.

TABLE 1

|  | Conversion Efficiency (%) |
|---|---|
| Example 1 | 8.7 |
| Example 2 | 9.0 |
| Example 3 | 7.8 |
| Example 4 | 8.5 |
| Example 5 | 8.6 |
| Comparative Example 1 | 3.2 |

The results shown in Table 1 reveal that the solar cells of Examples 1 to 5 each exhibit a heat exchange coefficient remarkably higher than that of the solar cell of Comparative Example 1.
(Production of Solar Cell Module)

Example 6

The dye-sensitized solar cell module shown in FIG. 3 was produced.

First, transparent electrode substrate 31 (manufactured by Nippon Sheet Glass, Co., Ltd., trade name: SnO$_2$ Coated Glass: 60 mm long×37 mm wide) with conductive layer 32 formed on a surface was prepared, and conductive layer 32 was cut by forming scribe lines 33 by laser scribing in parallel in the lengthwise direction in the SnO$_2$ film on the surface of transparent electrode substrate 31. Scribe lines 33 were formed at four positions in total, that is, one at a position of 9.5 mm away from the left edge of the glass substrate serving as the supporting body, and three at intervals of 7 mm therefrom. The formed scribe lines each have a width of 100 µm.

Then, porous semiconductor layers 34 were formed in accordance with Example 1. One of porous semiconductor layers 34 having dimensions of a thickness of 25 µm, a width of 5 mm, and a length of 50 mm was formed centering at a position of 6.9 mm away from the left edge of the glass substrate, and three of porous semiconductor layers 34 having similar dimensions were formed at intervals of 7 mm from the center of this porosity semiconductor film.

Porous insulation layers 35 were formed on porous semiconductor layers 34 in accordance with Example 1. One of the porous insulation layers having dimensions of a width of 5.6 mm and a length of 50.4 mm was formed centering at a position of 6.9 mm away from the left edge of light-transmissive substrate 31, and three of the porous insulation layers having similar dimensions were formed at intervals of 7 mm from the center of the leftmost porous insulation layer 5.

Then, counter electrode conductive layers 36 were formed in accordance with Example 1. One of the counter electrode conductive layers having dimensions of a width of 5.6 mm and a length of 50 mm was formed centering at a position of 7.2 mm away from the left edge of transparent electrode substrate 31, and three of the counter electrode conductive layers having similar dimensions were formed at intervals of 7 mm from the center of the leftmost porous insulation layer 5.

Then, Pt was deposited on counter electrode conductive layers 36 in accordance with Example 1 to obtain catalyst layers 37. It is to be noted that the catalyst layers were identical in size and position to porous semiconductor layers 34.

The obtained laminate was immersed in the dye solution used in Example 1 at a room temperature for 120 hours to cause porous semiconductor layers 34 to adsorb the dye.

Then, the ultraviolet-cured resin (31X-101 manufactured by ThreeBond Co., Ltd.) was spread between the laminates and around the cells with a dispenser (ULTRASAVER manufactured by EFD Corp.), to which a glass substrate of 60 mm long×30 mm wide was affixed as cover layer 38, followed by ultraviolet radiation by means of a UV lamp (NOVACURE manufactured by EFD Corp.) to cure the photosensitive resin, thereby forming sealing member 39.

Then, the same electrolyte solution as that in Example 1 was injected through the injection pore for electrolyte solution previously provided in the glass substrate used as the cover layer, and an ultraviolet-cured resin was further spread, followed by ultraviolet radiation similarly to the sealing member to cure the photosensitive resin for sealing, thereby forming carrier transport layer 40, so that the module was completed.

The Ag paste (manufactured by FUJIKURAKASEI CO., LTD., trade name: DOTITE) was spread on the obtained module as collector electrode portion 41.

Example 7

After counter electrode conductive layer 36 was formed in Example 6, pores were formed in the above-described counter electrode conductive layer through use of laser. It is to be noted that the pores were arranged in an array, and formed to have a pore diameter of 50 µm and at an interval of 150 µm both in the X direction and the Y direction. The pores were formed only in a portion where the porous semiconductor layer was projected. Except this, the dye-sensitized solar cell was produced in accordance with Example 1.

Example 8 except that counter electrode conductive layer 36 was produced in accordance with Example 3 in Example 6, a module was produced in accordance with Example 6.

Comparative Example 2

Except that the catalyst layer was formed on the porous insulation layer in Example 6, and that the counter electrode conductive layer was further formed on the catalyst layer, the module was produced in accordance with Example 6, however, it was confirmed that the counter electrode conductive layer was stripped off.
(Evaluation Method and Results)

A black mask whose opening had an area of 13 cm$^2$ was disposed on the light-receiving surface of each of the solar cells of Examples 6 to 8 and Comparative Example 2, and each of these solar cells was irradiated with light having an intensity of 1 kW/m$^2$ (AM 1.5 solar simulator) to measure the photoelectric conversion efficiency. The results are shown in Table 2.

TABLE 2

|  | Conversion Efficiency (%) |
| --- | --- |
| Example 6 | 7.0 |
| Example 7 | 7.2 |
| Example 8 | 6.6 |
| Comparative Example 2 | 2.8 |

The results shown in Table 2 reveal that the solar cells of Examples 6 to 8 each exhibit a heat exchange coefficient remarkably higher than that of the solar cell module of Comparative Example 2.

It should be construed that embodiments and examples disclosed herein are by way of illustration in all respects, not by way of limitation. It is intended that the scope of the present invention is defined by claims, not by the description above, and includes all variations equivalent in meaning and scope to the claims.

DESCRIPTION OF THE REFERENCE SIGNS 1 supporting body; 2, 32 conductive layer; 3, 33 scribe line; 4 photoelectric conversion layer; 5, 35 porous insulation layer; 6, 36 counter electrode conductive layer; 7, 37 catalyst layer; 8, 38 cover layer; 9, 39 sealing member; 10, 40 carrier transport layer; 11 dye-sensitized solar cell; 12 transparent electrode substrate; 31 transparent electrode substrate; 34 porous semiconductor layer; 41 collector electrode portion; 43 solar cell module.

The invention claimed is:

1. A dye-sensitized solar cell comprising:
a supporting body made of a light-transmissive material;
a laminate in which a conductive layer, a photoelectric conversion layer having a porous semiconductor layer with a dye adsorbed therein, a porous insulation layer, a counter electrode conductive layer, and a catalyst layer are laminated in an order presented, the counter electrode conductive layer being in direct contact with the catalyst layer,
said photoelectric conversion layer and said porous insulation layer being filled with a carrier transport material,
wherein pores are formed in said counter electrode conductive layer,
wherein said catalyst layer material does not reach said porous insulation layer; and
wherein said counter electrode conductive layer is made of one type of material selected from the group consisting of indium-tin complex oxide, fluorine-doped tin oxide, and zinc oxide.

2. The dye-sensitized solar cell according to claim 1, wherein the pores of said counter electrode conductive layer have a diameter of 0.1 μm to 100 μm, and the pores of said counter electrode conductive layer are formed at an interval of 1 μm to 200 μm.

3. A method of producing a dye-sensitized solar cell comprising the steps of:
forming, on a conductive layer formed on a surface of a supporting body made of a light-transmissive material, a laminate in which a photoelectric conversion layer having a porous semiconductor layer with a dye adsorbed therein, a porous insulation layer, a counter electrode conductive layer, and a catalyst layer are laminated in an order presented, the counter electrode conductive layer being in direct contact with the catalyst layer;
forming a sealing member on an outer periphery of said laminate; and
injecting a carrier transport material into a space held between said conductive layer at an inner side relative to said sealing member, and carried by said sealing member,
said method comprising a step of forming said counter electrode conductive layer by vapor deposition; and
wherein said counter electrode conductive layer is made of one type of material selected from the group consisting of indium-tin complex oxide, fluorine-doped tin oxide, and zinc oxide.

4. A method of producing a dye-sensitized solar cell comprising the steps of:
forming, on a conductive layer formed on a surface of a supporting body made of a light-transmissive material, a laminate in which a photoelectric conversion layer having a porous semiconductor layer with a dye adsorbed therein, a porous insulation layer, a counter electrode conductive layer, and a catalyst layer are laminated in an order presented, the counter electrode conductive layer being in direct contact with the catalyst layer;
forming a sealing member on an outer periphery of said laminate; and
injecting a carrier transport material into a space held between said conductive layer at an inner side relative to said sealing member, and carried by said sealing member,
said method comprising a step of forming pores in said counter electrode conductive layer; and
wherein said counter electrode conductive layer is made of one type of material selected from the group consisting of indium-tin complex oxide, fluorine-doped tin oxide, and zinc oxide.

5. The method of producing a dye-sensitized solar cell according to claim 4, wherein the pores of said counter electrode conductive layer are formed through use of laser.

6. A dye-sensitized solar cell module in which two or more dye-sensitized solar cells are connected in series, at least one of said dye-sensitized solar cells being the dye-sensitized solar cell defined in claim 1, a catalyst layer or a counter electrode conductive layer of one of said dye-sensitized solar cells and a conductive layer of an adjacent one of said dye-sensitized solar cells being electrically connected.

7. The dye-sensitized solar cell according to claim 1, wherein the catalyst layer does not contact with a cover layer located opposite to the catalyst layer.

* * * * *